United States Patent [19]

Ono et al.

[11] Patent Number: 5,080,873
[45] Date of Patent: Jan. 14, 1992

[54] APPARATUS FOR GROWING CRYSTALS

[75] Inventors: Naoki Ono, Omiya; Michio Kida, Urawa; Yoshiaki Arai, Omiya; Kensho Sahira, Yono, all of Japan

[73] Assignee: Mitsubishi Materials Corporation, Tokyo, Japan

[21] Appl. No.: 521,683

[22] Filed: May 10, 1990

Related U.S. Application Data

[63] Continuation-in-part of Ser. No. 266,054, Nov. 2, 1988, abandoned.

[30] Foreign Application Priority Data

Nov. 2, 1987 [JP] Japan ................. 62-277894
Nov. 2, 1987 [JP] Japan ................. 62-277895

[51] Int. Cl.$^5$ ............... C30B 35/00; C30B 15/02; B65G 11/08
[52] U.S. Cl. ................... 422/249; 422/245; 156/617.1; 156/620.4; 156/DIG. 64; 156/DIG. 115; 193/27; 414/208; 414/299
[58] Field of Search ......... 156/617.1, 620.4, DIG. 64; 422/245, 249, 253; 414/208, 299; 193/27, 32

[56] References Cited

U.S. PATENT DOCUMENTS

| 293,898 | 2/1884 | Martin | 193/27 |
|---|---|---|---|
| 1,234,710 | 7/1917 | Adams | 414/299 |
| 1,795,986 | 3/1931 | Adams | 414/299 |
| 1,795,988 | 3/1931 | Adams | 414/299 |
| 1,795,989 | 3/1931 | Adams | 414/299 |
| 2,634,842 | 4/1953 | Caylor | 422/249 |
| 2,892,739 | 6/1959 | Rusler | 422/249 |
| 3,265,469 | 9/1964 | Hall | 422/249 |
| 4,203,951 | 5/1980 | Goriletsky | 422/249 |
| 4,330,362 | 5/1982 | Zulehner | 422/249 |
| 4,379,021 | 4/1983 | Damen et al. | 156/DIG. 115 |

FOREIGN PATENT DOCUMENTS

| 0170856 | 2/1986 | European Pat. Off. . |
| 0206555 | 12/1986 | European Pat. Off. . |
| 319466 | 10/1932 | Fed. Rep. of Germany . |
| 57-121685 | 1/1956 | Japan . |
| 57-40119 | 8/1982 | Japan . |
| 57-183392 | 11/1982 | Japan . |
| 59-33552 | 8/1984 | Japan . |
| 61-36197 | 2/1986 | Japan . |
| WO86/06764 | 11/1986 | PCT Int'l Appl. . |
| 784617 | 10/1957 | United Kingdom . |

Primary Examiner—Gary P. Straub
Attorney, Agent, or Firm—Cushman, Darby & Cushman

[57] ABSTRACT

A crystal growing apparatus includes a crucible, a feed pipe and a pulling mechanism. The crucible serves to melt a crystalline material. The feed pipe serves to cause the crystalline material to fall into the crucible to charge the crucible with the crystalline material. The pulling mechanism serves to pull a single-crystal from the molten material in the crucible. The feed pipe has a lower end positioned slightly above the surface of the molten material in the crucible and including a plurality of baffle plates mounted on an inner peripheral wall thereof in longitudinally spaced relation to one another. The baffle plates are arranged so that a pitch defined between adjacent two baffle plates decreases toward the lower end of the feed pipe.

6 Claims, 6 Drawing Sheets

FIG. 1
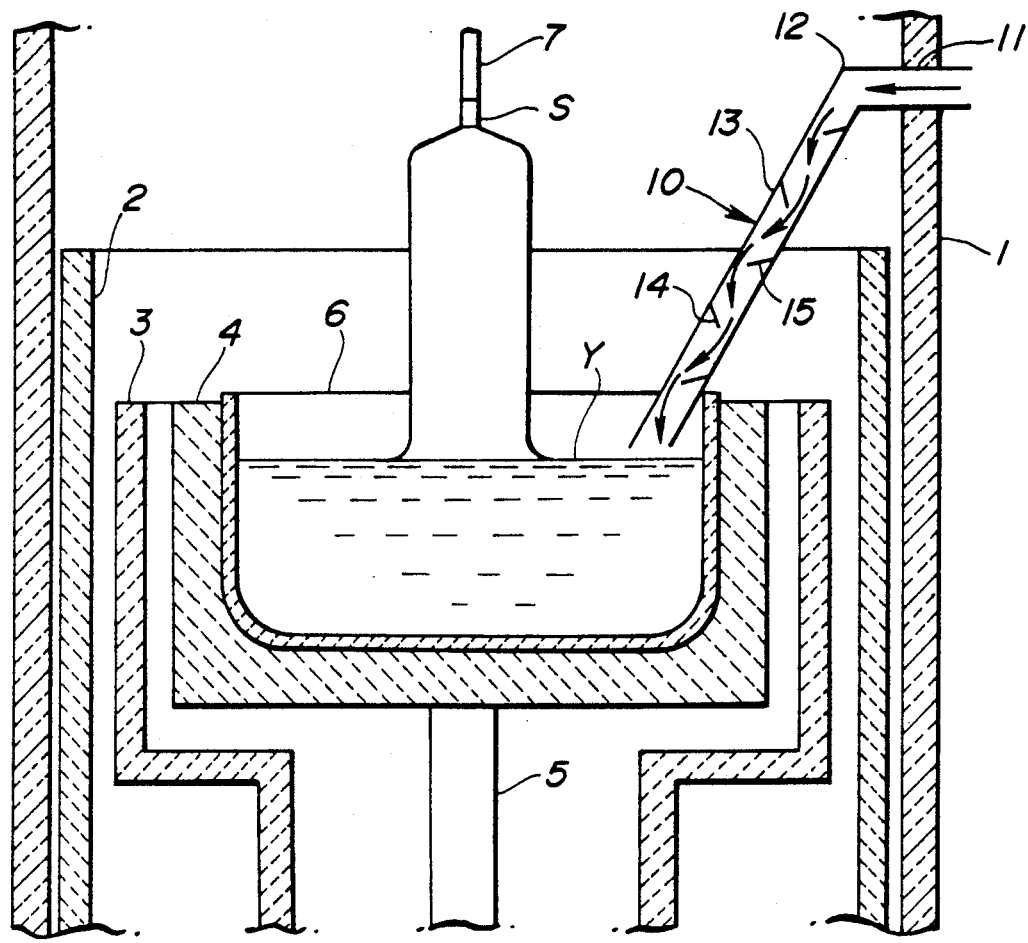
FIG. 2
FIG. 3
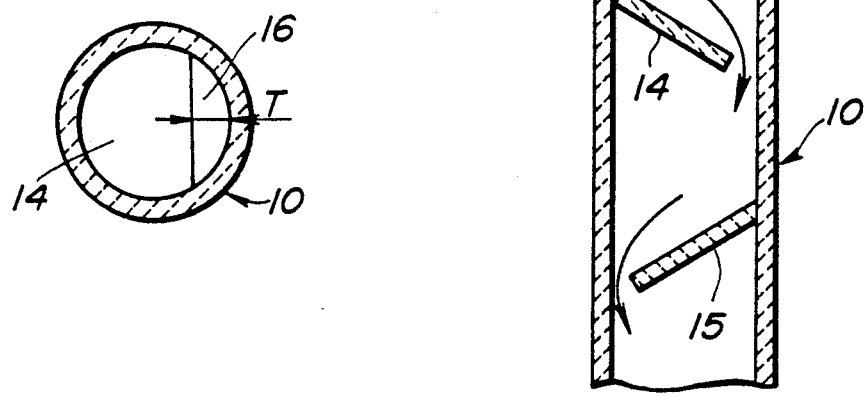

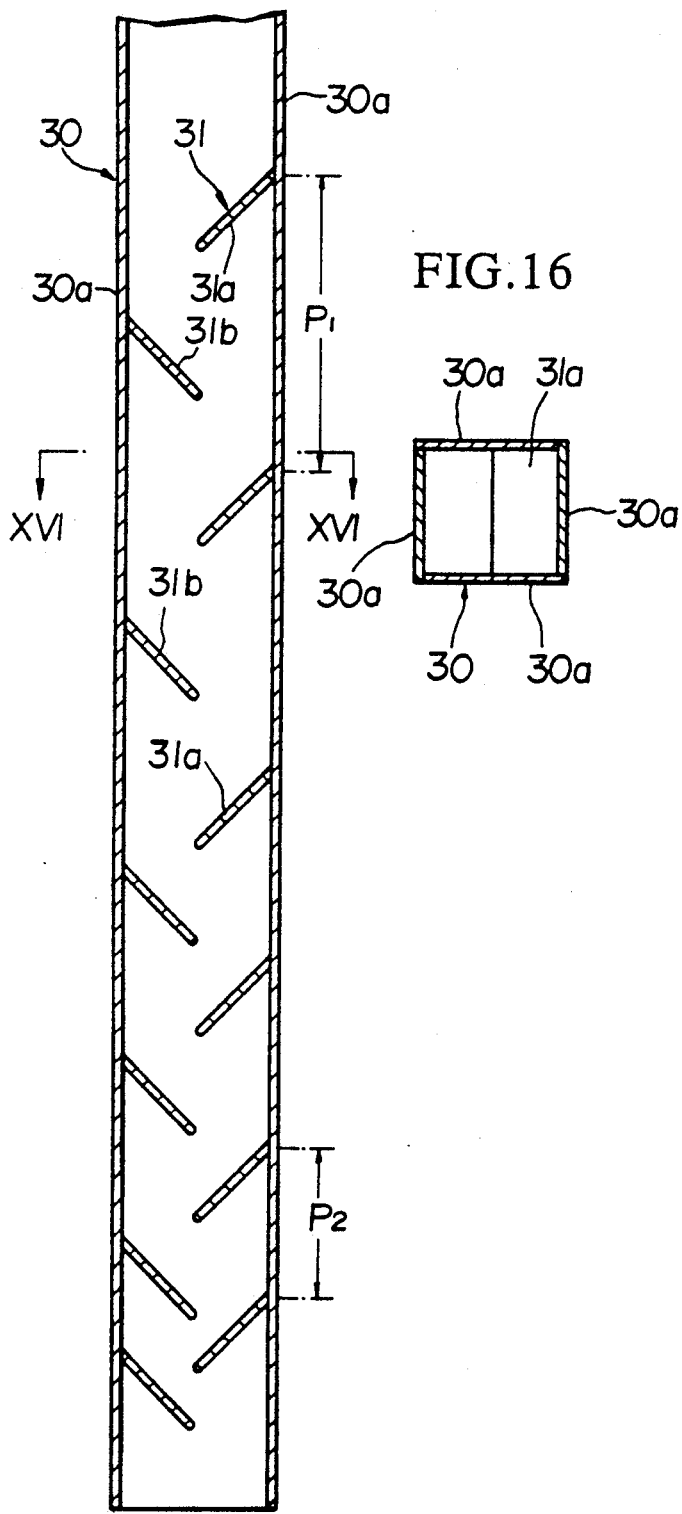
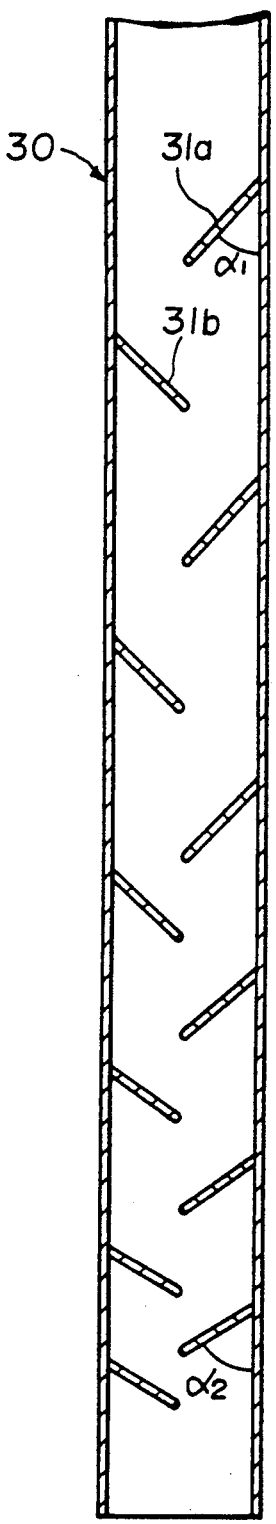

APPARATUS FOR GROWING CRYSTALS

CROSS REFERENCE TO A RELATED APPLICATION

This application is a continuation-in-part of our application Ser. No. 266,054 filed Nov. 2, 1988, now abandoned.

BACKGROUND OF THE INVENTION

1. Field of the Invention

The present invention pertains to an apparatus for growing crystals such as high purity silicon single-crystals.

2. Prior Art

In the manufacture of silicon single-crystals by Czochralski technique, the contact area between a silicon melt and a quartz crucible varies as the quantity of the melt decreases due to the pulling of the crystals, and hence the quantity of oxygen dissolved from the crucible varies. In recent years, however, severe standards have been adopted as to both oxygen and dopant concentrations of silicon single-crystals for use as substrates for semiconductor devices. For this reason, it has been only a part of the ingot that can be utilized as the semiconductor devices, deteriorating the yield of material.

Proposed in order to obviate the above problem is an apparatus of the type which keeps the quantity of the melt constant by continuously adding granulated silicon powder material to a crucible to compensate the amount of the pulled crystal (Examined Japanese Patent Application Publication No. 57-40119). In such apparatus, however, the surface of the melt is ruffled upon the falling of the material to develop a disturbance which is transmitted to the crystallization front of the single-crystal ingot, so that crystal defects such as dislocation are caused.

To cope with this problem, a cylindrical partition wall has been disposed between the single-crystal ingot and the portion into which the material falls U.S. Pat. No. 2,892,739 and Non-Examined Japanese Patent Application Nos. 57-183392 and 61-36197). However, there still remains a disturbance which is transmitted to the crystallization front through apertures formed to communicate the outer and inner sides of the partition wall. Besides, the provision of such partition wall requires the use of a crucible greater in size since the space between the partition wall and the crucible as well as the space between the crucible and the crystal ingot has to be rendered sufficiently large. As a result, a large quantity of silicon material is required to ensure a sufficient depth of the silicon melt, resulting in an increase of costs as compared with the apparatus without the partition wall. In addition, the above apparatuses have further disadvantages that the silicon crystals are liable to deposit on the surface of the partition wall, so that the conditions on crystal growth may vary. On a certain occasion, the growing of single-crystals may be even hindered.

SUMMARY OF THE INVENTION

It is therefore an object of the present invention to provide an improved apparatus for growing crystals which can prevent the ruffling and disturbance of the surface of the melt without providing the partition wall.

According to the present invention, there is provided an improved apparatus for melting a crystalline material and growing a single-crystal from the molten material, the apparatus comprising a crucible for melting the crystalline material, a feed pipe for causing the crystalline material to fall into the crucible to charge the crucible with the crystalline material, and pulling means for pulling the single-crystal from the molten material in the crucible, characterized by deceleration means mounted on the feed pipe for lowering the falling speed of the crystalline material into the crucible.

BRIEF DESCRIPTION OF THE DRAWINGS

FIG. 1 is a cross-sectional view of an apparatus in accordance with the present invention;

FIG. 2 is a transverse sectional view of a feed pipe of the apparatus of FIG. 1;

FIG. 3 is a longitudinal sectional view of the feed pipe of the apparatus of FIG. 1;

FIG. 15 is an enlarged cross-sectional view of the feed pipe employed in the apparatus of FIG. 14;

FIG. 16 is a cross-sectional view taken along the line XVI—XVI in FIG. 15;

FIG. 17 is a modification of the feed pipe of FIG. 15;

DESCRIPTION OF THE PREFERRED EMBODIMENTS OF THE INVENTION

Figure 4:
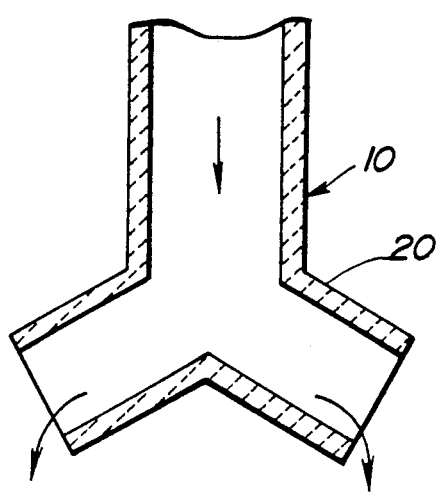
FIGS. 4 to 7 are cross-sectional views showing modifications of the feed pipe of the apparatus of FIG. 1, respectively.

Referring to FIGS. 1 through 3 of the accompanying drawings, there is illustrated an apparatus for growing crystals in accordance with the present invention. The apparatus comprises a furnace 1, a heat insulating shell 2 housed in the furnace, a heater 3 disposed in the heat insulating shell, a graphite susceptor 4 or support bowl mounted on a shaft 5 and a quartz crucible 6 accommodated in and supported by the susceptor. The shaft 5 is drivingly connected to a drive mechanism, not shown, which permits the vertical movement and axial rotation of the shaft 5 during operation. A crystal pulling mechanism, which comprises a pulling wire 7 retaining a seed crystal S at its lower end, and a drive mechanism, not shown, for pulling and rotating the wire, is also disposed above the crucible 6.

The structure as described above is similar to that of the prior art apparatus, and the feature of the apparatus in accordance with the invention resides in the special design of a material feed pipe as designated at 10.

The feed pipe 10, which has a cross-section of a circular shape and is made of quartz, is fixedly secured to and supported by the furnace 1 with its portion at 11 passing through the furnace wall. The pipe is connected at its one end to a material supply mechanism, not shown, and is bent at 12 within the furnace 1 so as to be inclined downwardly toward the interior of the crucible 6. The other end of the feed pipe 10 is positioned adjacent to the inner peripheral surface of the crucible 6 so as to be disposed slightly above the surface of a melt at Y.

The inclined portion as at 13 is provided with deceleration means for reducing the falling speed of the material through the pipe. More specifically, a plurality of upper and lower baffle plates 14, 15 of quartz are fixedly secured to the inner peripheral wall of the inclined portion 13 so as to be alternately disposed in longitudinally equally spaced relation to each other. Each upper baffle plate 14, which is mounted on a downwardly facing surface of the inner peripheral wall of the pipe, is inclined downwardly toward its upwardly facing surface, while each lower baffle plate 15, which is mounted on the upwardly facing surface, is inclined downwardly toward the downwardly facing surface. Each baffle plate 14, 15 defines a gap or space 16 between its lower end and the inner wall of the pipe. The minimum width T of the space 16 is set so that the granulated powder material can easily pass therethrough, and that the falling speed of the material can be appropriately reduced. Further, the inclination angle of the baffle plate 14, 15 is set by taking the inclination angle of the pipe into consideration so that the material should not remain there and that the falling speed of the material is decreased below a prescribed value.

In the crystal growing apparatus as described above, the material falling through the feed pipe 10 is caused to collide with the baffle plates 14 and 15 to lose its kinetic energy, and besides its path is bent complicatedly. As a result, the falling speed of the material into the melt Y can be reduced, and the ruffling of the melt Y can be rendered sufficiently small. Accordingly, the crystallization front of the single-crystal ingot becomes less susceptible to disturbance which may cause crystal dislocation, so that single-crystals of a high quality having no defects can be manufactured at a high yield. Besides, since a smaller crucible can be employed as compared with the prior art apparatus having a partition wall, the residual quantity of the material can be reduced substantially, so that the yield is further increased. The disadvantage that the crystal may adhere to the partition wall can as well be obviated.

Further, since the residence time of the material within the feed pipe 10 is prolonged, the material can be preheated by the atmosphere in the furnace 1. Consequently, the temperature variation caused due to the supply of the material can be reduced, and the unnecessary recrystallization of the melt can be prevented.

Further, in the foregoing, the material to be added may be in the form of flakes or chips other than granules.

FIG. 4 depicts a modified apparatus in accordance with the present invention which differs from the previous apparatus only in that the lower end of the feed pipe 10 is branched off to provide a breeches pipe portion 20. The breeches pipe portion, each pipe portion of which is inclined with respect to the remaining portion, is disposed in such a manner that the pipe portions are directed circumferentially of the crucible 6. With this construction, the falling speed of the material can be further reduced since the material collides with the breeches pipe portion. In addition, inasmuch as the material is scattered circumferentially of the crucible 6, the ruffling of the melt Y can be further prevented.

Figure 5:
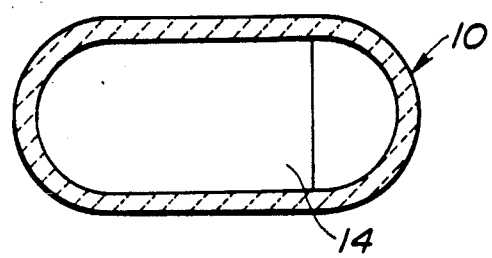

FIG. 5 shows another modified apparatus in accordance with the present invention which differs from the first embodiment shown in FIGS. 1 to 3 in that the feed pipe 10 is elongated transversely so as to have an elliptical cross section. Although not illustrated, the pipe could as well be formed to have a rectangular cross section. In this embodiment, the deceleration effect can be further improved, and the residence time can be further prolonged to enhance the heating effect.

Figure 6:
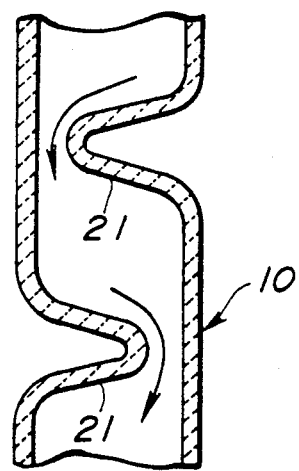
Figure 7:
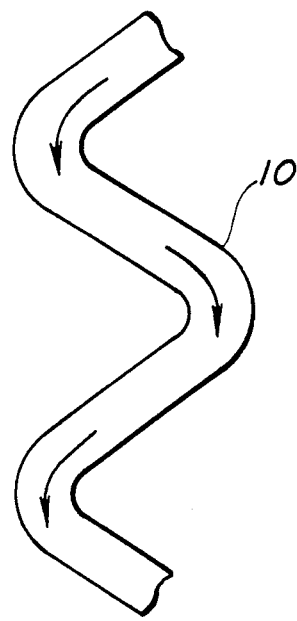

Although in the above embodiments, the baffle plates 14 and 15 are provided as the deceleration means, the upwardly and downwardly facing portions of the wall of the feed pipe 10 may be alternately recessed to provide a plurality of protrusions 21 serving as the deceleration means as shown in FIG. 6. Further, as illustrated in FIG. 7, the feed pipe may be formed so as to meander spirally to provide the deceleration means. The feed pipes of these two embodiments can be manufactured at a reduced cost.

Figure 9:
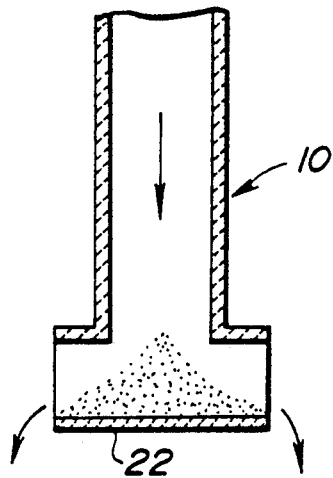
FIG. 9 is a cross-sectional view showing a feed pipe of the apparatus of FIG. 8.
Figure 8:
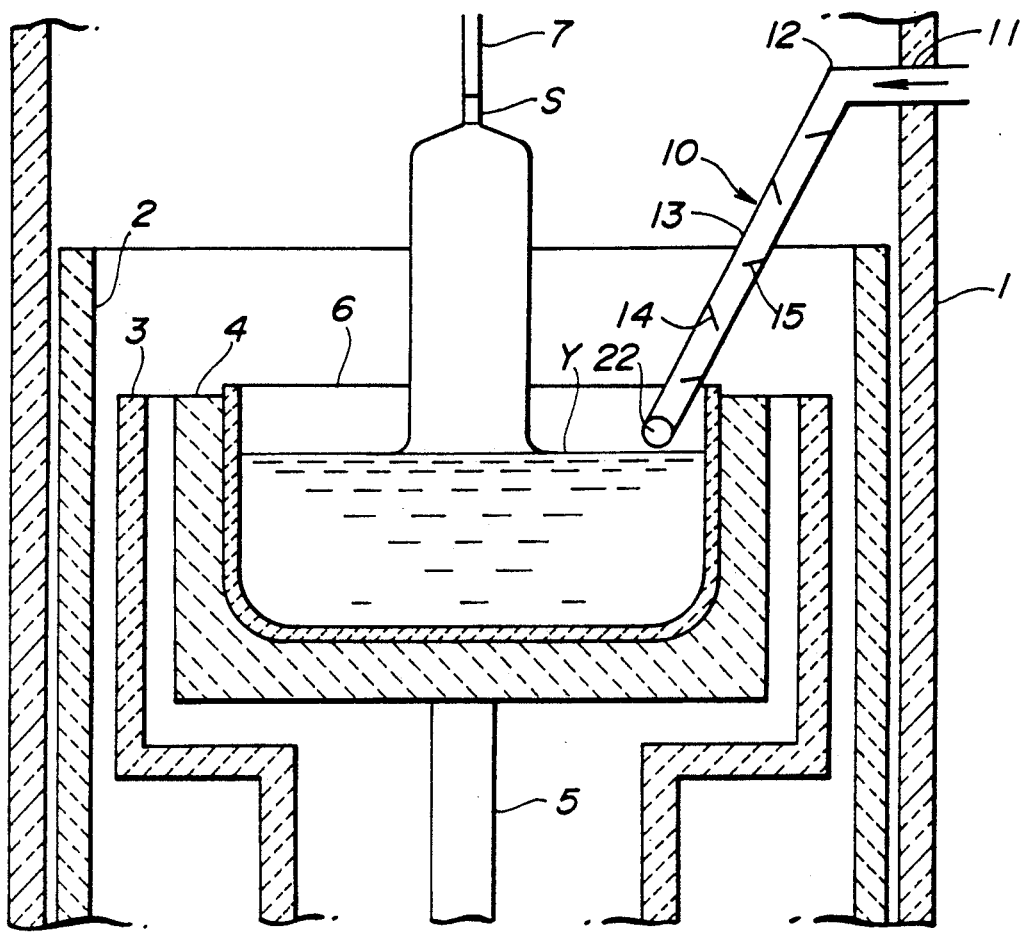
FIG. 8 is a view similar to FIG. 1, but showing a further modified apparatus of the invention.

FIGS. 8 and 9 depict a further modified apparatus in accordance with the present invention which differs from the embodiment of FIG. 4 only in that the breeches pipe portion is horizontally formed to define a tee pipe portion 22. The horizontal length and diameter of the tee pipe portion 22 are set so that the material falling through the feed pipe 10 is held at the tee portion for a desired length of time and then is caused to fall into the melt Y.

In this embodiment, the material is caused to fall into the melt after having been held at the tee portion 22 for a prescribed length of time. As a result, the material undergoes a radiant heat for a longer period of time, and besides thermal conduction is caused through the inner bottom surface of the tee pipe portion 22. Accordingly, the material can be markedly heated before it falls into the melt. Therefore, the temperature difference between the material and the melt can be rendered small, so that the temperature fluctuation of the melt due to the addition of the material can be effectively eliminated. Consequently, the material newly added to the melt can be certainly dissolved and the solidification of the melt can be surely prevented, so that the development of crystal defects due to the temperature fluctuation in the crystallization front can be prevented.

In order to clarify the effect of this embodiment, the temperature rise of a silicon material particle due to the heat radiation will be hereinafter calculated. Suppose the particle size D and emmisivity $\epsilon$ to be 1 mm and 0.45, respectively. Other parameters of the particle will be set forth as follows.

Surface area:

$$S = 4\pi(D/2)^2 = 3.142 \times 10^{-6} (m^2)$$

Volume:

$$V = 4/3\pi(D/2)^3 = 5.24 \times 10^{-10} (m^3)$$

Mass:

$$M = \gamma V = 1.22 \times 10^{-6} (kg)$$

Heat capacity:

$$C = MC_p = 8.3 \times 10^{-4} (J/°C)$$

Radiant energy transferred to the particle for a period of t seconds:

$$Q = 4.88 S\epsilon((1273/100)^4 \times ((T+273)/100)^4 \times 10^3 \times 4.187 \times 1/60^2 t (J)$$

wherein T (°C.) denotes the temperature of the particle while the temperature of the atmosphere of Ar gas is set to be 1,000° C.

Increase of temperature of the particle:

$$\Delta T = Q/C (°C.)$$

Thus, the change of the increase of the particle temperature with the passage of time will be as follows.

| Initial temperature | 25° C. | In 1 second | 276° C. |
|---|---|---|---|
| In 2 seconds | 510° C. | In 3 seconds | 704° C. |
| In 4 seconds | 840° C. | In 5 seconds | 920° C. |
| In 6 seconds | 962° C. | In 7 seconds | 982° C. |
| In 8 seconds | 992° C. | In 9 seconds | 996° C. |
| In 10 seconds | 998° C. | | |

It takes 0.32 seconds when the silicon particle is caused to fall 50 cm in a free condition, and hence only about 100° C. increases according to the above formula. Accordingly, it is clear that the temperature of the particle can be markedly increased by prolonging the falling period of time by several seconds. In addition, although in the above calculation, the radiation heat transfer is only taken into consideration, thermal conduction is in fact caused by the high temperature atmospheric gas in the feed pipe 10 as well as by the contact of the material with the inner peripheral surface of the feed pipe. Accordingly, the temperature would be still more increased by the prolongation of the residence time.

Figure 10:
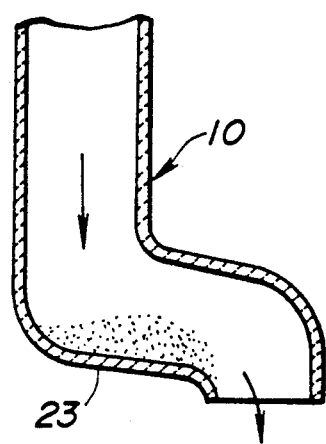
FIGS. 10 to 12 are cross-sectional views showing modifications of the feed pipe of FIG. 9.

FIG. 10 shows a further modified apparatus according to the present invention which differs from the previous embodiment shown in FIGS. 8 and 9 only in that the tee pipe portion is replaced by a bent portion 23 of a prescribed length slightly sloping downwardly and extending circumferentially of the crucible 6. Such bent portion 23 serves to cause the material falling through the feed pipe to move slowly therealong. With this arrangement, the residence time can be easily regulated by modifying the inclination angle or length of the bent portion 23. Besides, since the bent portion 23 is disposed near to the melt, the material moving therealong undergoes a great radiant heat.

Figure 11:
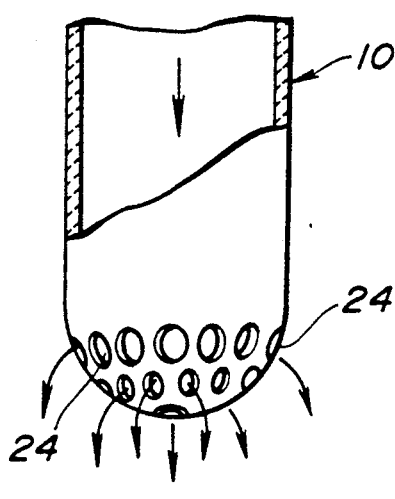
Figure 12:
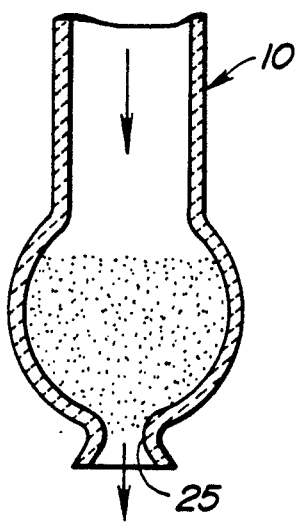

FIG. 11 shows a further modification in which the lower end of the feed pipe 10 is formed into a closed semispherical shape, and a number of apertures 24 are formed therethrough. FIG. 12 shows a modified apparatus in which the lower end of the feed pipe is formed into an expanded spherical shape and a small through hole 25 is formed in its lower face.

In the embodiments shown in FIGS. 8 to 12, the tee pipe portion, bent portion, semispherical portion and spherical portion respectively serve as means for holding the material in the feed pipe for a prescribed length of time.

Figure 13:
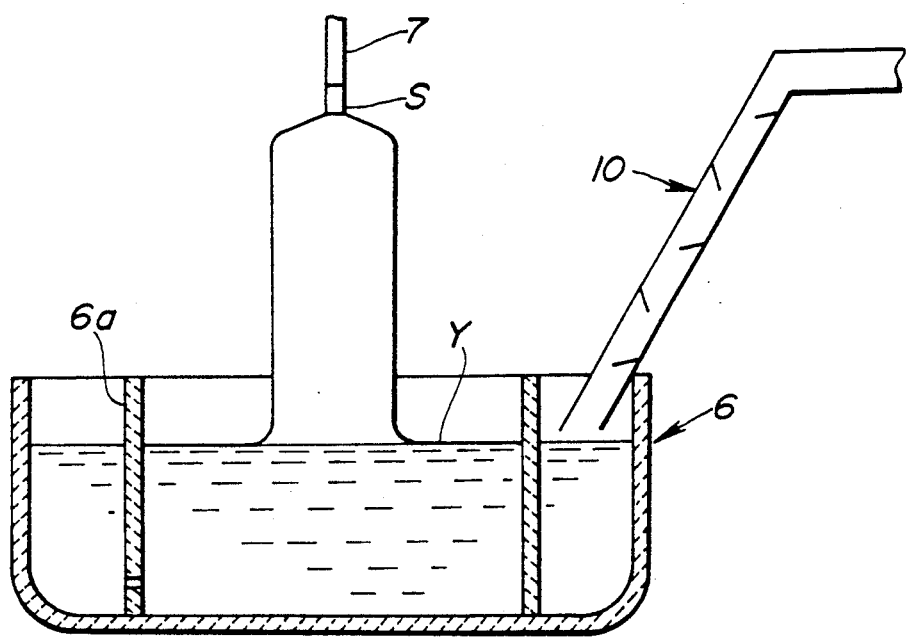
FIG. 13 is a cross-sectional view of a part of a still further modified apparatus of the invention.

Each embodiment may be practiced alone or in combination with any one of the other embodiments. Besides, as shown in FIG. 13, a crucible with a partition wall 6a may be employed to make the prevention of the disturbance of the melt Y more perfect.

Figure 14:
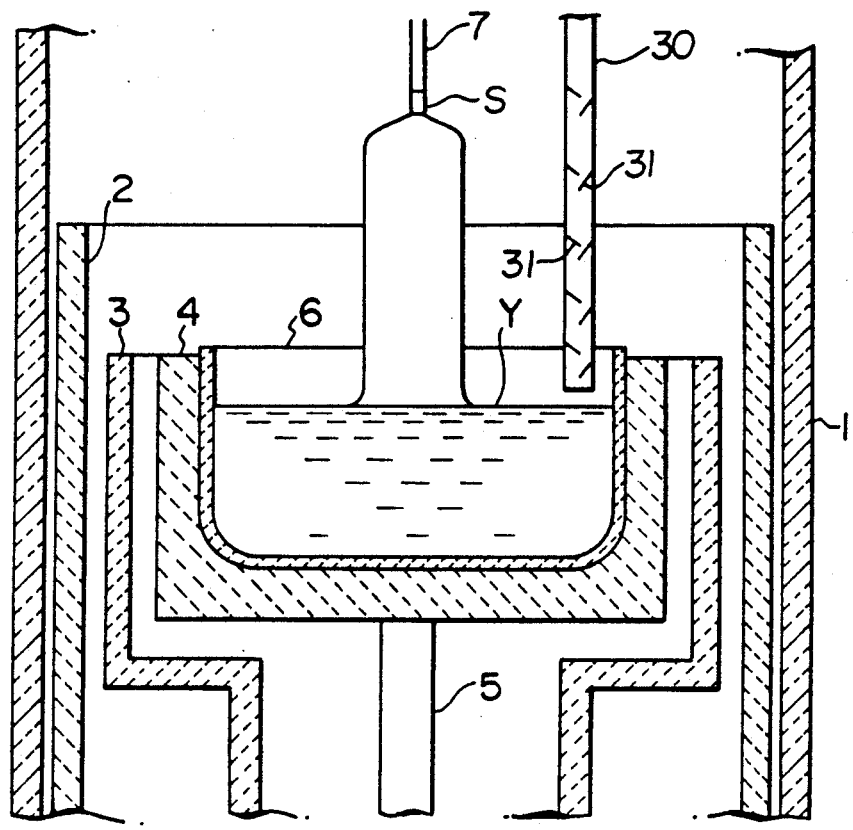
FIG. 14 is a view similar to FIG. 1, but showing a further modification of the apparatus in accordance with the present invention.

FIG. 14 depicts a still further modified apparatus in accordance with the present invention which includes a quartz feed pipe 30 having a square cross-section. A plurality of quartz baffle members 31 are securely fixed to the inner peripheral wall of the feed pipe in longitudinally spaced relation to one another. As illustrated in FIGS. 15 and 16, the feed pipe 30 is arranged vertically so that its lower end is positioned slightly above the surface of the melt at Y. The feed pipe 30 comprises four wall plates 30a joined to one another by welding, and the baffle members 31 comprise a plurality of first baffle plates 31a mounted on one of the wall plates 30a in longitudinally spaced relation to one another and a plurality of second baffle plates 31b mounted on the wall plate opposite to the above wall plate. Each group of baffle plates are disposed so that a pitch between the adjacent two baffle plates decreases toward the lower end of the feed pipe 30, and each first baffle plate 31a is shifted from a respective second baffle plate which is arranged in opposed relation thereto. In the case where the feed pipe has a diameter of 15 mm to 25 mm, the greatest pitch P1 in the uppermost portion preferably ranges from 50 mm to 100 mm while the smallest pitch P2 in the lowermost portion preferably ranges from 30 mm to 50 mm.

With this construction, the material falling through the feed pipe 30 is caused to collide with the baffle plates 31a and 31b, and hence the falling speed of the material into the melt Y can be reduced, and the ruffling of the melt Y can be reduced sufficiently small. In particular, since the pitch between the baffle plates are set so as to decrease toward the lower end of the feed pipe 30, the falling speed can be reduced very effectively. In addition, inasmuch as the feed pipe 30 has a shape of a square cross-section, the material collide with the walls strongly compared with the case of a feed pipe of a circular cross-section, resulting in a sufficient reduction of falling speed. Furthermore, in the case where a feed pipe of a circular cross-section is used, it is rather difficult to secure baffle plates on its inner peripheral surface since the pipe and baffles are made of quartz. However, when a feed pipe of a square cross-section is used, a feed pipe with baffle plates can be easily manufactured by preparing two elongated plates each of which has baffle plates secured thereto, arranging them with other two plates, and welding them to one another.

The feed pipe of FIG. 15 may be modified so as to have a cross-section of another quadrilateral shape such as rectangle as necessary. It may be made of molybdenum and coated with $SiO_2$. Furthermore, in the feed pipe of FIG. 15, the baffle plates are inclined at the same inclination angle. However, as depicted in FIG. 17, the inclination angle may be modified so that it increases toward the lower end of the feed pipe 30. The smallest angle α1 of the baffle plate in the uppermost portion may be preferably 45 degrees while the largest angle α2 in the lower portion may preferably be 60 degrees. With this modification, the falling speed of the material through the feed pipe 30 can further be reduced in an optimum manner.

Figure 18:
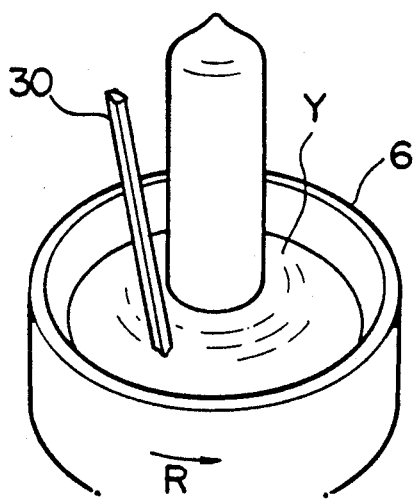
FIG. 18 is a schematic perspective view of another modification of the apparatus of FIG. 14.
Figure 19:
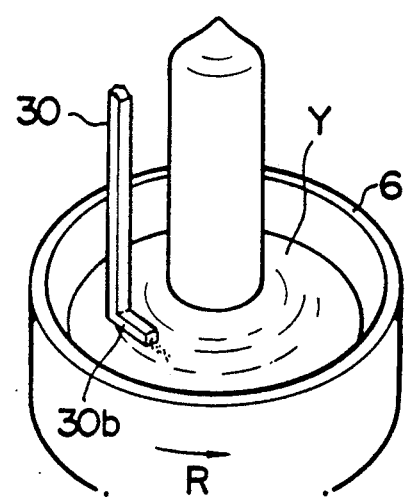
FIG. 19 is a view similar to FIG. 18, but showing a further modification of the apparatus of FIG. 18.

Furthermore, FIG. 18 depicts a modified arrangement of the apparatus of FIG. 14 in which the feed pipe 30 is arranged so as to be inclined downwardly toward the interior of the crucible 6 in a direction of rotation R of the crucible 6. With this modification, the material can be supplied into that portion of the melt Y which is sufficiently spaced from both of the single-crystal and the inner wall of the crucible, and hence a single-crystal of a high quality can be pulled. FIG. 19 depicts a further modification of the arrangement and structure of the feed pipe 30. In this embodiment, the feed pipe has a generally horizontal bent portion 30b disposed at its lower end portion and directed and opening in the direction of rotation R of the crucible 6. This horizontal portion 30b serves as a holding portion for retaining the crystalline material therein for a prescribed length of time. Therefore, the material can be sufficiently heated in advance.

What is claimed is:

1. An apparatus for melting a crystalline material and growing a single-crystal from the molten material, comprising;

a crucible for melting the crystalline material;

a downwardly inclined feed pipe for causing the crystalline material to fall into said crucible to charge said crucible with the crystalline material, said feed pipe having a lower end positioned slightly above the surface of said molten material in said crucible, said lower end being aligned with a direction of rotation of said crucible, said feed pipe having a quadrilateral cross-section comprising four wall plates, said feed pipe being made of a material selected from the group consisting of quartz and SiO$_2$ coated molybdenum;

a plurality of baffle plates each mounted to said feed pipe so as to extent into a flow path therethrough, said plurality of baffle plates being provided along a portion of the length of the feed pipe from a point upstream of said lower end to a point adjacent said lower end and including:

first baffle plates each mounted to and extending from an inner surface of one of said wall plates; and second baffle plates mounted to and extending from an inner wall of another wall plate which is defined in opposed, facing relation to said one wall plate, said first baffles and said second baffles alternating extending towards the longitudinal axis of said feed pipe, said first baffle plates and said second baffle plates being mounted to said respective walls such that a spacing between adjacent baffle plates is greatest at an upstream end of said plurality of baffle plates and is least adjacent said lower end of said feed pipe and gradually decreases from said upstream end to said downstream end, each of said first baffle plates and second baffle plates being inclined with respect to said longitudinal axis of said feed pipe so as to extend in a downstream direction of said feed pipe; and pulling means for pulling the single-crystal from the molten material in said crucible.

2. a crystal growing apparatus as defined in claim 1, wherein the angle described by said longitudinal axis of said feed pipe and the upstream surface of a said baffle plate gradually increases towards said lower end of said feed pipe.

3. A crystal growing apparatus as defined in claim 2, wherein said angle ranges from 45° to 60°.

4. A crystal growing apparatus as defined in claim 1, wherein said feed pipe is made of quartz.

5. A crystal growing apparatus as defined in claim 1, wherein said lower end of said feed pipe is formed to have a generally horizontal portion defining a holding portion for retaining the crystalline material therein.

6. A crystal growing apparatus as defined in claim 1, wherein said spacing at an upstream portion of said feed pipe ranges from 50–100 mm and wherein said spacing adjacent the lower end of said feed pipe ranges from 30–50 mm.

* * * * *